(12) United States Patent
Meier

(10) Patent No.: US 10,505,581 B2
(45) Date of Patent: Dec. 10, 2019

(54) ELECTRICAL CIRCUIT FOR TRANSMITTING A USEFUL ANALOGUE SIGNAL WITH A COMPENSATION CIRCUIT FOR COMPENSATING FOR DISTORTIONS IN THE USEFUL SIGNAL

(71) Applicant: Thomas Meier, Starnberg (DE)

(72) Inventor: Thomas Meier, Starnberg (DE)

( * ) Notice: Subject to any disclaimer, the term of this patent is extended or adjusted under 35 U.S.C. 154(b) by 0 days.

(21) Appl. No.: 16/348,120

(22) PCT Filed: Oct. 23, 2017

(86) PCT No.: PCT/EP2017/076986
§ 371 (c)(1),
(2) Date: May 7, 2019

(87) PCT Pub. No.: WO2018/091229
PCT Pub. Date: May 24, 2018

(65) Prior Publication Data
US 2019/0349020 A1    Nov. 14, 2019

(30) Foreign Application Priority Data
Nov. 15, 2016 (DE) .......... 10 2016 121 865

(51) Int. Cl.
*H04B 1/62* (2006.01)
*H03K 17/693* (2006.01)
(Continued)

(52) U.S. Cl.
CPC .......... *H04B 1/62* (2013.01); *H03K 17/6871* (2013.01); *H03K 17/693* (2013.01); *H04B 1/44* (2013.01)

(58) Field of Classification Search
None
See application file for complete search history.

(56) References Cited

U.S. PATENT DOCUMENTS

| 5,038,113 A | 8/1991 | Katz et al. |
| 6,307,436 B1 | 10/2001 | Hau |

(Continued)

FOREIGN PATENT DOCUMENTS

| DE | 1037292 A1 | 6/1991 |
| DE | 1239551 A1 | 6/1993 |

OTHER PUBLICATIONS

Cheng et al. "RF Circuit Linearity Optimization Using a General Weak Nonlinearity Model," IEEE Transactions on Circuits and Systems I: Regular Papers, IEEE, US, vol. 59, No. 10, Oct. 1, 2012, pp. 2340-2353, XP011465560.

(Continued)

*Primary Examiner* — Lana N Le
(74) *Attorney, Agent, or Firm* — Carter, DeLuca & Farrell LLP

(57) ABSTRACT

The invention relates to an electrical circuit (1) for transmitting a useful analogue signal which has a signal transmission path (16) with an input path (2) and an output path (3) and one or more switches (4-6), with which switch or switches the useful signal which is carried on the input path (2) can be connected through to the output path (3) by the switch or the switches (4-6) being switched to the switched-on state. According to the invention, the electrical circuit (1) comprises a compensation circuit (7) which has one or more auxiliary switches (17) of the same type as the switch or the switches (4-6), and the auxiliary switch or switches (17) is or are coupled to the signal transmission path (16) such that said auxiliary switch or switches generates or generate signal distortion in the switched-on state, which signal distortion substantially compensates for a distortion in the useful analogue signal which is generated by the switch or switches (4-6).

8 Claims, 6 Drawing Sheets

(51) Int. Cl.
  *H03K 17/687* (2006.01)
  *H04B 1/44* (2006.01)

(56) References Cited

U.S. PATENT DOCUMENTS

| | | | | |
|---|---|---|---|---|
| 6,346,853 | B1* | 2/2002 | Kangaslahti | H03F 1/3276 |
| | | | | 330/149 |
| 2005/0264341 | A1 | 12/2005 | Hikita et al. | |
| 2006/0194558 | A1 | 8/2006 | Kelly | |
| 2009/0181630 | A1* | 7/2009 | Seshita | H04B 1/006 |
| | | | | 455/191.3 |
| 2012/0218025 | A1* | 8/2012 | Honea | H02M 1/126 |
| | | | | 327/427 |
| 2014/0335801 | A1* | 11/2014 | Bolton | H04B 15/02 |
| | | | | 455/83 |
| 2015/0031318 | A1* | 1/2015 | McCallister | H03F 1/3247 |
| | | | | 455/114.3 |
| 2015/0155906 | A1* | 6/2015 | Budka | H04B 1/006 |
| | | | | 455/78 |
| 2015/0180466 | A1* | 6/2015 | Kishimoto | H03K 17/162 |
| | | | | 327/382 |
| 2016/0285447 | A1* | 9/2016 | Krishnamurthi | H03K 17/693 |
| 2018/0041170 | A1* | 2/2018 | Zhu | H03K 17/102 |
| 2018/0075925 | A1* | 3/2018 | Hurrell | G11C 27/02 |
| | | | | 455/114.3 |
| 2019/0199338 | A1* | 6/2019 | Zamprogno | H03K 17/08122 |

OTHER PUBLICATIONS

International Search Report issued by the European Patent Office as the International Searching Authority on Jan. 24, 2018 in corresponding International Application No. PCT/EP2017/076986, with English translation.

* cited by examiner

ELECTRICAL CIRCUIT FOR TRANSMITTING A USEFUL ANALOGUE SIGNAL WITH A COMPENSATION CIRCUIT FOR COMPENSATING FOR DISTORTIONS IN THE USEFUL SIGNAL

TECHNICAL FIELD OF THE INVENTION

The invention relates to an electrical circuit for transmitting an analog useful signal on a signal transmission path, in which one or more switches are arranged, with which switch or switches the useful signal carried on the input path can be transferred to the output path.

Electrical circuits, to which reference shall be made in the following, are used in the mobile telecommunication field for transmitting an analog useful signal from an input to an output or for separating the output from the signal source. The useful signal is typically a high-frequency modulated signal that contains, for example, language or image information.

Such electrical circuits can also have several input paths and several output paths, which can be interconnected or separated from one another via switches. A useful signal being carried on one of the input paths can thus be transferred to one or more of the output paths by actuating the switches accordingly.

As switches, use is generally made of analog switches (e.g., field-effect transistors) because they offer particularly low transmission losses, rapid switching capability, and a high level of insulation of the switched-off path. However, use is also made of diodes, in particular PIN diodes. The switch is brought into the high-resistance or low-resistance portion of the characteristic curve by applying a control voltage (in the case of a field-effect transistor) or a control current (in the case of a PIN diode).

Known field-effect transistors have a transfer curve (I-V curve) such as the one shown as an example in FIG. 2. In the switched-on state "ON", a field-effect transistor is usually operated in the steepest area of the characteristic curve. The current $I_D$ flowing through the field-effect transistor is thus relatively high with relatively low voltages $V_{DS}$, wherein D denotes "Drain" and S denotes "Source". The "ON" state, in other words the steepest branch of the characteristic curve field of FIG. 2, is reached by applying a corresponding gate voltage. Because of the non-linear transfer curve in this area, a field-effect transistor (but also a PIN diode) generates a distortion that overlaps the useful signal. Hence the analog useful signal is distorted in the switched-on state of the switch, which may negatively affect the transmission quality of the useful signal.

An electrical circuit for transmitting an analog signal via a signal transmission path is known from DE 42 39 551 A1. The signal transmission path comprises an input path and an output path as well as at least one component, with which component or components the useful signal carried on the input path can be transferred to the output path. In this case also, the component (e.g., a FET) can generate a signal distortion.

U.S. Pat. No. 6,307,436 B1 also discloses an electrical circuit for compensating for a signal distortion that is generated by a FET. Another compensation circuit is known from DE 40 37 292 A1. However, the known compensation circuits are relatively complex in construction and can be further improved in terms of their effect.

OBJECT OF THE INVENTION

This invention thus has as an object the creation of an electrical circuit for transmitting an analog useful signal on a signal transmission path comprising an input path and an output path that can be electrically interconnected or separated from one another by means of at least one switch, which circuit, in the switched-on state of the at least one switch, causes substantially less distortion of the analog useful signal.

This object is solved according to the invention by the features listed in Claim 1. Other designs of the invention are the subject matter of the subordinate claims.

According to the invention, an electrical circuit for transmitting an analog useful signal on a signal transmission path is proposed, which has one or more switches, by means of which the useful signal carried on an input path can be transferred to an output path. According to the invention, the electrical circuit comprises a compensation circuit having one or more auxiliary switches of the same type as the switch or switches arranged in the signal transmission path, wherein the auxiliary switch or switches is or are coupled to the signal transmission path such that in the switched-on state, the auxiliary switch or switches generates or generate a signal distortion that substantially compensates for a distortion of the analog useful signal that is generated by the switch or switches.

According to this invention, the term "input path" is understood to denote a section of the signal transmission path that is situated on the input side, i.e., on the side of a signal source, with respect to the switch or switches arranged in the signal transmission path. The term "output path" is understood to denote a section of the signal transmission path that is situated on the output side, i.e., on the side of an electrical load, with respect to the switch or switches arranged in the signal transmission path.

As already described above, transistors, in particular FET transistors, or diodes, in particular PIN diodes, can be used as switches. The same applies to the auxiliary switch or switches of the compensation circuit. When it is stated that the compensation circuit has one or more auxiliary switches "of the same type" as the switch or switches arranged in the signal transmission path, it means that if a transistor is used as a switch, then the auxiliary switch is also a transistor, and that if a diode is used as a switch, then the auxiliary switch is also a diode.

According to a preferred embodiment of the invention, the auxiliary switch or switches is or are designed as substantially smaller than the switch or switches arranged in the signal transmission path. The smaller the auxiliary switches are, the less the power loss caused by the compensation circuit. However, it must be ensured that the signal distortion generated by the auxiliary switch or switches is sufficiently large and in phase opposition to that of the switch or switches arranged in the signal transmission path. In this context, the aforementioned definition "designed as smaller" means that an auxiliary switch in the switched-on, saturated state carries a smaller current than a switch arranged in the signal transmission path, given the same control voltage or control current.

An auxiliary switch is preferably designed as smaller by a factor of 2 to 10 or more than 10 times smaller than a switch arranged in the signal transmission path. In other words, the auxiliary switch carries at least a 50% to 90%, or more than 90% smaller current than a corresponding switch arranged in the signal transmission path.

The auxiliary switch or switches can be coupled in different manners to the signal transmission path, for example via a resistor, an inductor, a capacitor or a high-frequency coupler.

The auxiliary switch or switches can be connected with their load terminals (e.g., drain and source or collector and emitter) directly or indirectly, respectively, to the signal transmission path. "Directly connected" means that the load terminal concerned is directly connected to a node on the signal transmission path. "Indirectly connected" means that the load terminal concerned is connected to the signal transmission path via at least one other component. The aforementioned "other component" can be, for example, at least one element from the group: resistor, capacitor or inductor.

According to a variant of embodiment of the invention, the auxiliary switch or switches is or are situated in a path parallel to the signal transmission path.

According to another variant of embodiment, it is also possible for only one of the load terminals of the auxiliary transistor to be connected directly or indirectly to the signal transmission path. The other load terminal is preferably switched against a reference potential.

According to a first embodiment of the invention, at least one auxiliary switch is coupled to the signal transmission path via a resistor. The resistor and the at least one auxiliary switch thus form a series circuit in the form of a branch circuit, which is connected via a node to the signal transmission path and switched against a reference potential, e.g., ground.

According to a second embodiment of the invention, the compensation circuit comprises an inductor arranged in the signal transmission path and at least one auxiliary switch that is connected in parallel to the inductor.

According to a third embodiment of the invention, the compensation circuit comprises a capacitor, which is arranged in the signal transmission path, and at least one auxiliary switch, which is connected in parallel to the capacitor.

According to a fourth embodiment of the invention, the compensation circuit comprises a high-frequency coupler, which is arranged in the signal transmission path, and an auxiliary switch, the power terminals of which are connected to the high-frequency coupler.

The compensation circuit according to the invention can also comprise any combinations of the aforementioned embodiments.

According to the invention, the compensation circuit can be coupled either to the input path only or to the output path only or to both the input path and the output path. If several switches connected in series are provided in the signal transmission path, the compensation circuit can also be coupled between two switches connected in series, for example.

According to a special embodiment of the invention, the electrical circuit comprises several input paths and several output paths, which can be selectively electrically connected to one another or electrically decoupled from one another by means of switches. At least one switch is provided in each possible signal transmission path such that the useful signal carried on one of the input paths can be transferred to any one of the output paths. In such an embodiment, at least one compensation circuit is preferably provided for each possible signal transmission path. If a signal transmission path comprises several switches arranged in series, for example, an individual compensation circuit can also be assigned to each of the switches. However, as an alternative only one compensation circuit may be present.

The auxiliary switch or switches of the compensation circuit is or are preferably switched on or off synchronously to the switch or switches arranged in the signal transmission path. A control unit is provided for controlling the switches and auxiliary switches accordingly.

BRIEF DESCRIPTION OF THE DRAWINGS

In the following, the invention will be explained in an illustrative fashion in greater detail, with reference to the appended drawings, wherein.

DETAILED DESCRIPTION OF PREFERRED EMBODIMENTS

Figure 1:
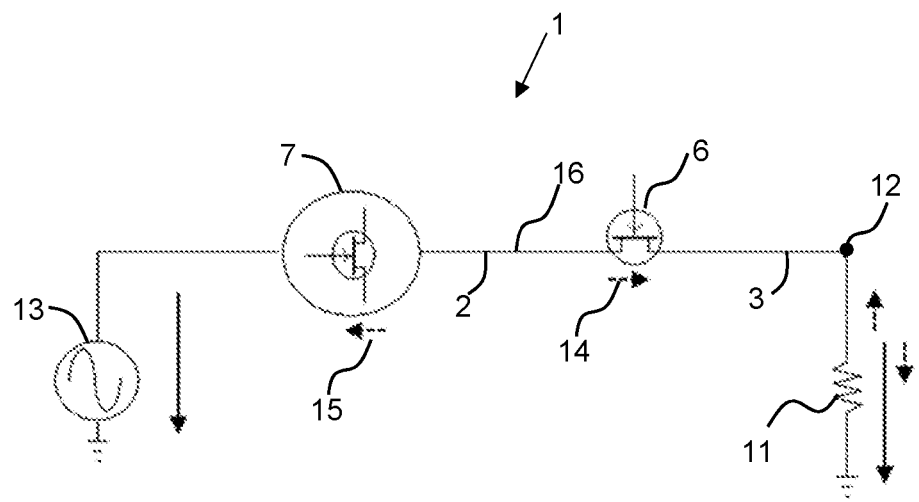
FIG. 1 shows an electrical circuit for transmitting an analog useful signal, which has a compensation circuit to compensate for distortions in the useful signal.

FIG. 1 shows an electrical circuit 1 for transmitting an analog useful signal, which is generated by a schematically illustrated signal source 13 and transmitted to an electrical load 11 illustrated at the output (on the right in the figure). The analog useful signal can be, for example, a high-frequency modulated signal, which contains language or image information, for example.

The electrical circuit 1 comprises a signal transmission path 16 with an input path 2 and an output path 3. A switch 6, by means of which the useful signal carried on the input path 2 can be transferred to the output path 3 or by means of which the input path 2 can be decoupled from the output path 3, is arranged in the signal transmission path 16. In order to connect the analog useful signal with the output, the switch 6 is brought into the low resistance state. For separating the input path 2 from the output path 3, the switch 6 is brought into the high resistance state.

Figure 2:
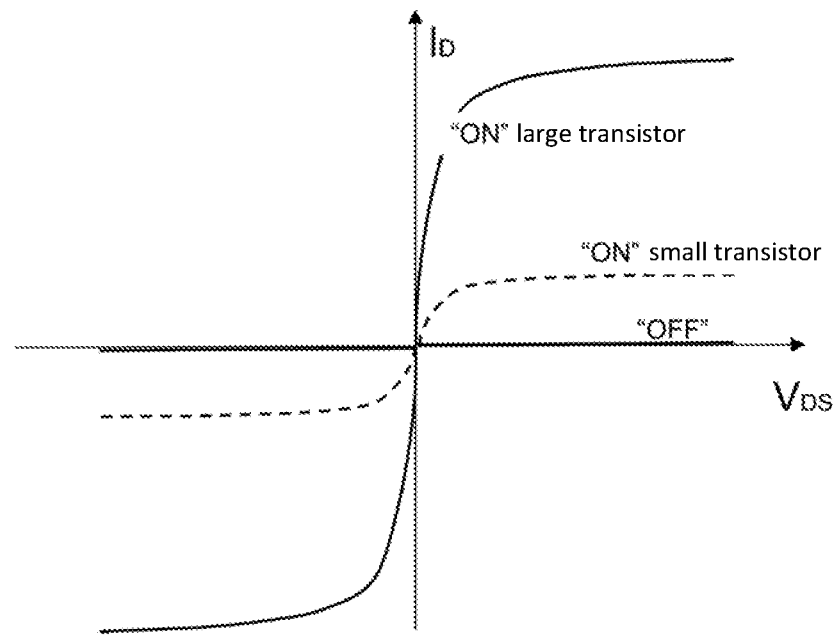
FIG. 2 shows a performance map with transmission curves of field-effect transistors of different sizes.

Said switch 6 can be, for example, a transistor such as a field-effect transistor or a diode, in particular a PIN diode. Instead of a single transistor or single diode, there can also be series circuits of several transistors or diodes. If such a switch 6 is in the low-resistance, i.e., switched-on state, owing to its non-linear transfer curve (see FIG. 2) the switch 6 causes a distortion of the analog useful signal. In order to compensate, at least partially, for this distortion of the useful signal, a compensation circuit 7 is provided, which is illustrated schematically in FIG. 1. Different embodiments of such a compensation circuit 7 are illustrated by way of example in more detail in FIGS. 3 to 10.

Figure 3:
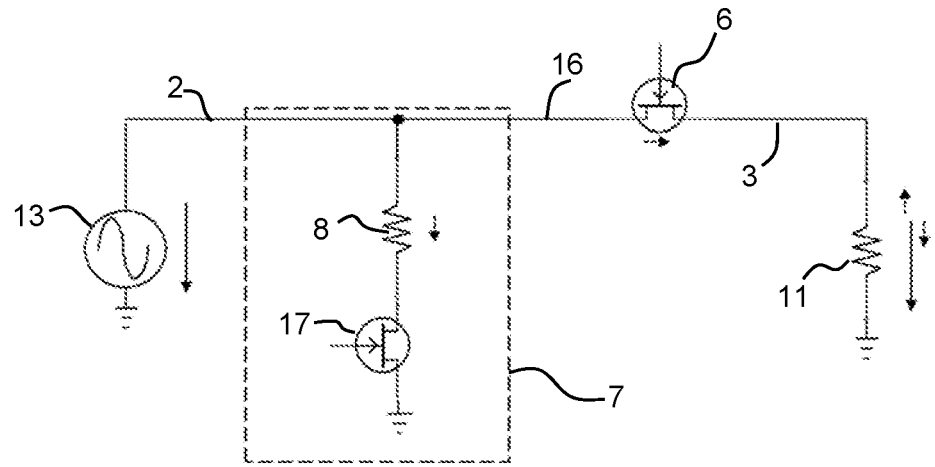
FIG. 3 shows an electrical circuit for transmitting an analog useful signal, which has a compensation circuit according to a first embodiment of the invention.

FIG. 3 shows an electrical circuit for transmitting an analog useful signal via a signal transmission path 16. A switch 6, with which the analog useful signal can be either be transferred to the output or with which the output path 3 can be decoupled from the input path 2, is situated in the signal transmission path 16. In this case the compensation circuit 7 comprises an auxiliary transistor 17, which is coupled via a resistor 8 to the signal transmission path 16. The resistor 8 and the auxiliary transistor 17 are connected in series in a branch circuit and connected to a reference potential, in this case the ground. Optionally, the compensation circuit 7 could also have several auxiliary switches 17, as illustrated by way of example in FIG. 8.

The auxiliary transistor or transistors 17 is or are ideally produced in the same production process as the actual switch 6 and therefore possesses or possess the same current/voltage characteristics as the actual switch 6. The auxiliary switch or switches 17 therefore has or have substantially the same distortion properties in the switched-on state as the switch 6. However, because the signal distortion generated by the auxiliary switch or switches 17 is in phase opposition to the distortion generated by the switch 6, the distortion present at the output of the electrical circuit can be substantially eliminated.

Figure 4:
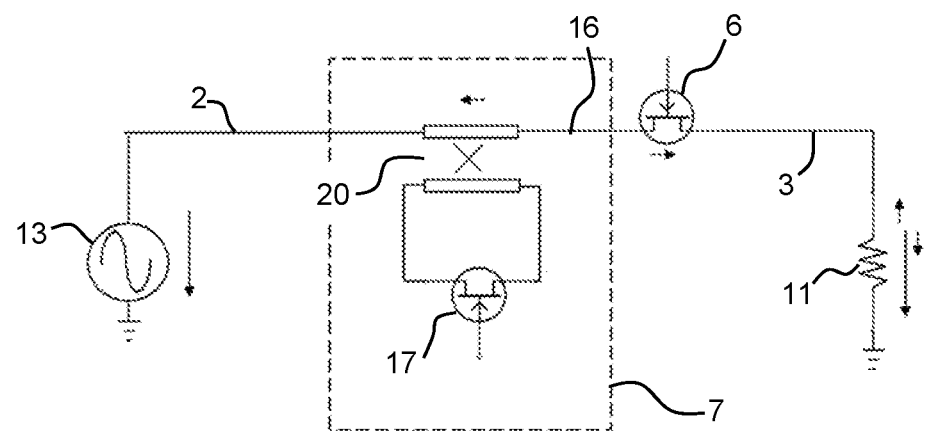
FIG. 4 shows an electrical circuit for transmitting an analog useful signal, which has a compensation circuit according to a second embodiment of the invention.

FIG. 4 shows an electrical circuit 1 for transmitting an analog useful signal, which has a compensation circuit 7 according to a second embodiment of the invention. Except for the compensation circuit 7, the electrical circuit 1 is identical in design to the circuit 1 of FIG. 3. Identical elements of the circuit 1 shall therefore not be discussed in any further detail.

The second embodiment of the compensation circuit 7 comprises a high-frequency coupler 20, by means of which an auxiliary transistor 17 is coupled to the signal transmission path 16. The auxiliary transistor 17 is thus connected by its power terminals to the high-frequency coupler 20. The decoupling and subsequent coupling of a part of the useful signal each bring about a 90° phase shifted distortion. As a whole, the compensation circuit 7 thus generates a signal distortion that is in phase opposition to the distortion caused by the switch 6. This embodiment has the advantage of high robustness against modifications of the load resistance 11.

Figure 5:
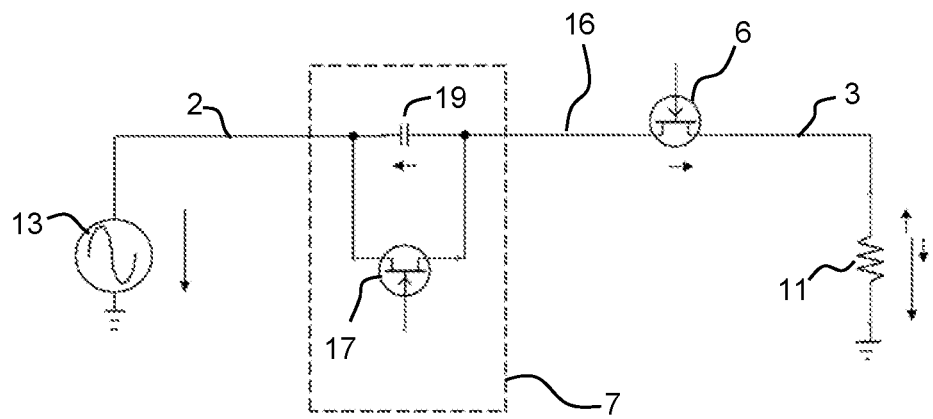
FIG. 5 shows an electrical circuit for transmitting an analog useful signal, which has a compensation circuit according to a third embodiment of the invention.

FIG. 5 shows an electrical circuit for transmitting an analog useful signal via a signal transmission path, which has a compensation circuit 7 according to a third embodiment of the invention. In this case the compensation circuit 7 comprises a capacitor 19, which is arranged in the signal transmission path 16, and an auxiliary transistor 17, which is connected in parallel to the capacitor 19. Here too the auxiliary transistor 17 generates a signal distortion, which is roughly as large as and in phase opposition to the distortion caused by the switch 6 arranged in the signal transmission path 16. In addition to high robustness against modifications of the load resistance 11, this embodiment has the advantage of being achievable in an expedient and space-saving manner.

Figure 6:
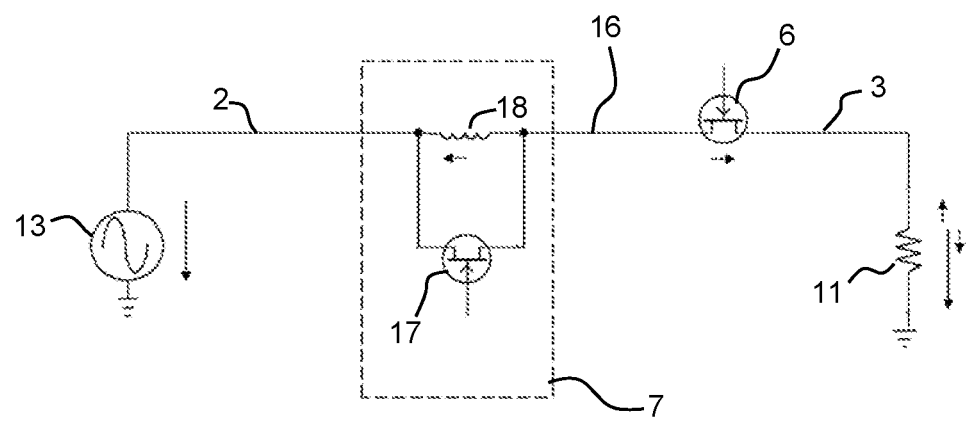
FIG. 6 shows an electrical circuit for transmitting an analog useful signal, which has a compensation circuit according to a fourth embodiment of the invention.

FIG. 6 shows an electrical circuit 1 for transmitting an analog useful signal via a signal transmission path 16, which has a compensation circuit 7 according to a fourth embodiment of the invention. In this case the compensation circuit 7 comprises an inductor 18, which is arranged in the signal transmission path 16, and an auxiliary transistor 17, which is connected in parallel to the inductor 18. Here too the auxiliary transistor 17 generates a signal distortion, which is roughly as large as and in phase opposition to the distortion caused by the switch 6 arranged in the signal transmission path 16. In addition to high robustness against modifications of the load resistance 11, this embodiment has the advantage of being achievable in an expedient and space-saving manner.

Figure 7:
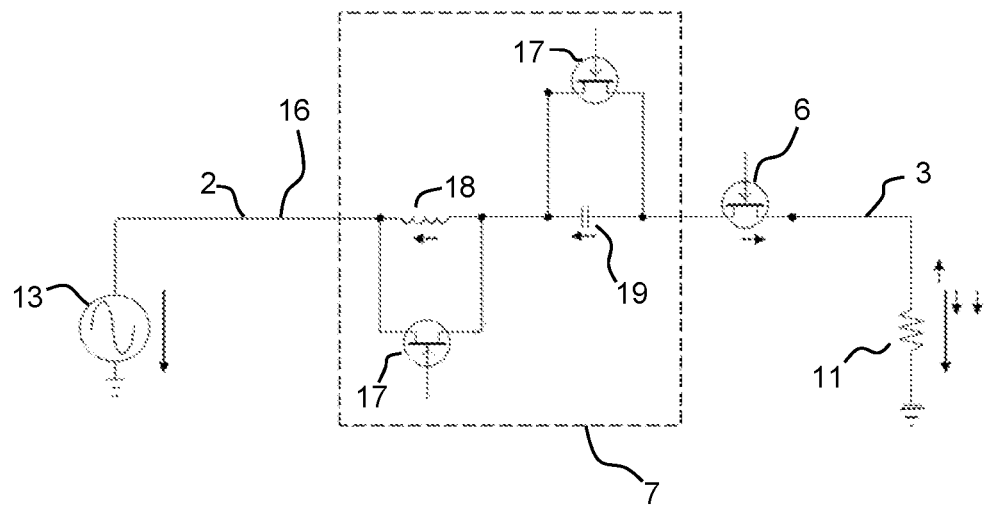
FIG. 7 shows an electrical circuit for transmitting an analog useful signal, which has a compensation circuit according to a fifth embodiment of the invention.

FIG. 7 shows an electrical circuit 1 for transmitting an analog useful signal via a signal transmission path 16, which has a compensation circuit 7 according to a fifth embodiment of the invention. As can be discerned, this compensation circuit 7 comprises elements of the compensation circuit of FIG. 5 as well as elements of the compensation circuit of FIG. 6. In this case both compensation circuits 7 of FIGS. 5 and 6 are arranged in the input path 2 of the electrical circuit 1. However, one or both compensation circuits 7 could also be arranged in the output path 3 of the electrical circuit 1.

The compensation circuit 7 of FIG. 7 has the advantage over the compensation circuits of FIG. 5 or FIG. 6 that a higher band width is achievable. For example, it is thus possible to achieve an optimum compensation at a specific first frequency by means of the part of the compensation circuit that contains the inductor 18 and an optimum compensation at another, second frequency with the other part of the compensation circuit 7 that receives the capacitor 19. As a cumulative effect, a good compensation of the distortion is also achievable in the range between these two frequencies.

Figure 8:
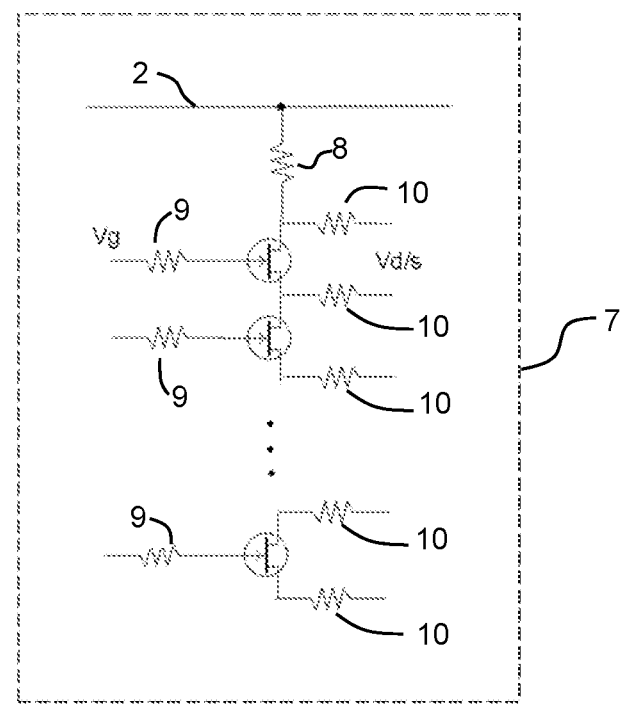
FIG. 8 shows an electrical circuit for transmitting an analog useful signal, which has a compensation circuit according to a sixth embodiment of the invention.

FIG. 8 shows a compensation circuit 7 according to a sixth embodiment of the invention. In this embodiment, several auxiliary transistors 17 are connected in series. In this case the auxiliary transistors 17 are connected in series in a branch circuit. They are connected via a resistor 8 to the signal transmission path 16. In each case a resistor 9 is connected to the control terminals (gates) of the individual auxiliary transistors 17. In each case resistors 10 are provided at the load terminals of the individual auxiliary transistors 17.

Figure 9:
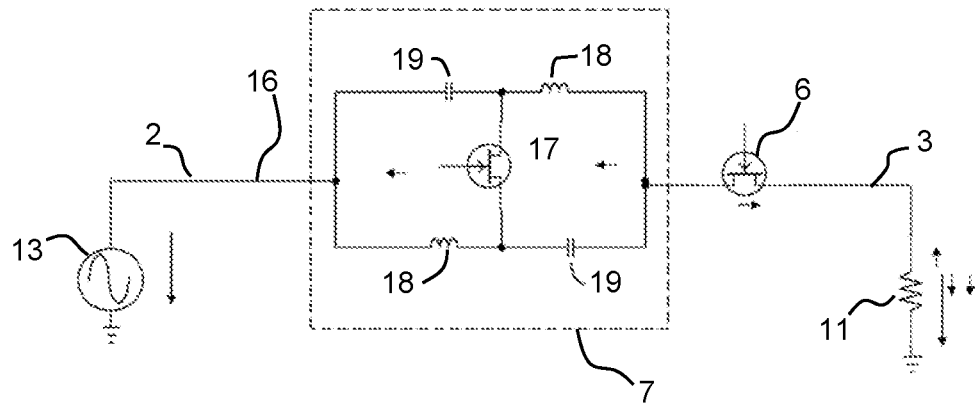
FIG. 9 shows an electrical circuit for transmitting an analog useful signal, which has a compensation circuit according to a seventh embodiment of the invention.

FIG. 9 shows an electrical circuit 1 for transmitting an analog useful signal via a signal transmission path 16, which has a compensation circuit 7 according to a seventh embodiment of the invention. In this case the compensation circuit 7 comprises a type of bridge circuit with two branches 21, 22, in which in each case a capacitor 19 and an inductor 18 are arranged antiparallel. An auxiliary transistor 17 is connected to the diagonal bridge section 23 by its load terminals. The distortions caused by the switch 6 can also be essentially completely compensated by such a circuit.

Figure 10:
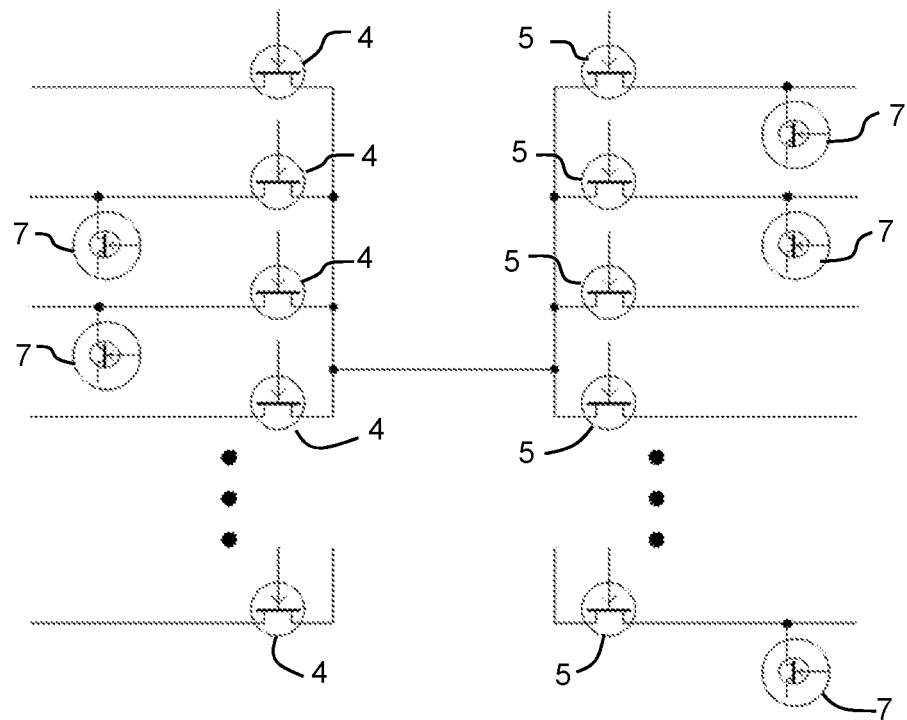
FIG. 10 shows an electrical circuit for transmitting an analog useful signal, which has several input paths and several output paths, in which any input path can be connected to or disconnected from any output path by using switches.

FIG. 10 shows an electrical circuit 1 for transmitting an analog useful signal with several input paths and several output paths, in which any input path 2 can be connected to or separated from any output path 3 using the switches 4 and 5. Each possible transmission path thus comprises two switches 4, 5 arranged in series. A compensation circuit 7 is also connected in each of the input and output paths.

Figure 11:
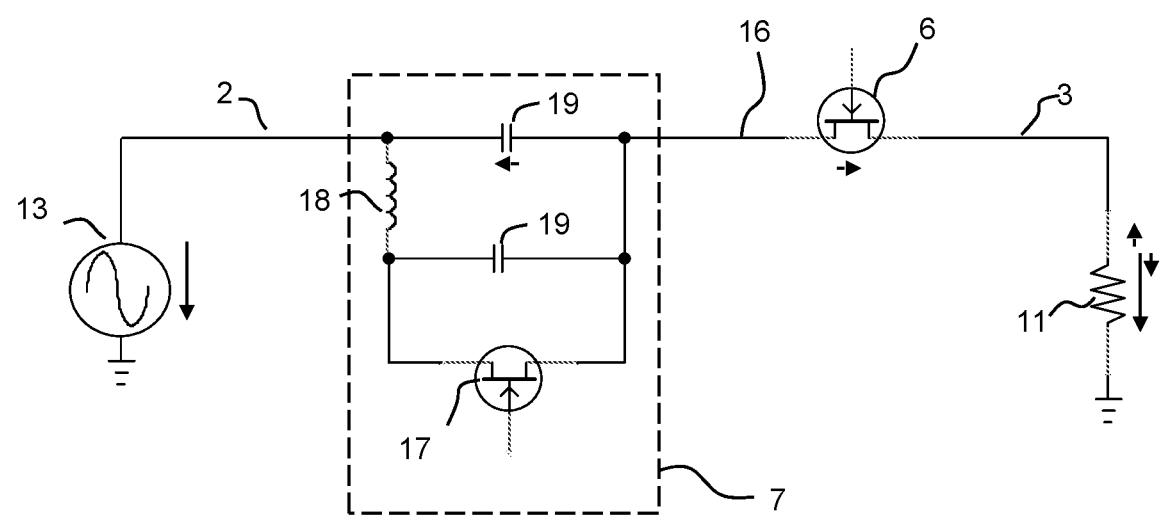
FIG. 11 shows an electrical circuit for transmitting an analog useful signal, which has a compensation circuit according to an eighth embodiment of the invention.

FIG. 11 shows a compensation circuit 7 according to an eighth embodiment of the invention, which comprises a capacitor 19 arranged in the signal transmission path 16. An inductor 18 and a parallel circuit composed of a further capacitor 19 and an auxiliary transistor 17 are connected in parallel to the capacitor 19, wherein the parallel circuit is connected with the elements 19, 17 in series to the inductor 18. In this case also, the auxiliary transistor 17 generates a signal distortion, which is roughly as large as and in phase opposition to the distortion caused by the switch 6 arranged in the signal transmission path 16.

The invention claimed is:

1. An electrical circuit for transmitting an analog useful signal, comprising a signal transmission path including an input path and an output path and one or more switches by means of which the useful signal which is carried on the input path can be transferred to the output path while the switch or switches are in a switched-on state, and further comprising a compensation circuit having one or more auxiliary switches of the same type as the switch or switches, wherein the compensation circuit comprises at least one inductor or capacitor which is connected in series to the one or more switches in the signal transmission path and wherein the at least one auxiliary switch is connected in parallel to the at least one inductor or capacitor, or is connected as a bridge circuit together with at least one inductor, or capacitor, such that the auxiliary switch or switches generate(s) a signal distortion in the switched-on state, which signal distortion substantially compensates for a distortion of the analog useful signal generated by the switch or switches in the switched-on state.

2. The electrical circuit according to claim 1, characterized in that the auxiliary switch or switches is or are designed substantially smaller such that it carries or they carry a smaller current in the switched-on state than a switch arranged in the signal transmission path, given the same control voltage or the same control current.

3. The electrical circuit according to claim 1, characterized in that the auxiliary switch or switches is or are designed smaller by at least a factor of 2 to 10, or more than 10 times smaller than the switch or switches arranged in the signal transmission path such that in the switched-on, saturated state, it carries or they carry a current that is smaller by said factor than a switch arranged in the signal transmission path, given the same control voltage or the same control current.

4. The electrical circuit according to claim 1, characterized in that the compensation circuit is coupled to the input path and/or to the output path of the electrical circuit.

5. The electrical circuit according to claim 1, characterized in that at least two switches connected in series are provided in the signal transmission path (16), with which switches a specific input path (2) can be electrically connected to or separated from a specific output path (3).

6. The electrical circuit according to claim 5, characterized in that the compensation circuit is coupled to the signal transmission path between two switches that are connected in series.

7. The electrical circuit according to claim 1, characterized in that it has several input paths and several output paths, which each comprise at least one switch such that an analog useful signal carried on one of the input paths can be transferred to any one of the output paths.

8. The electrical circuit according to claim 1, characterized in that the auxiliary switch or switches has or have the same current/voltage characteristics as the switch or switches of the electrical circuit.

* * * * *